(12) United States Patent
Jacobs et al.

(10) Patent No.: US 7,502,095 B2
(45) Date of Patent: Mar. 10, 2009

(54) LITHOGRAPHIC APPARATUS, DEVICE MANUFACTURING METHOD, AND DEVICE MANUFACTURED THEREBY

(75) Inventors: Johannes Henricus Wilhelmus Jacobs, Eindhoven (NL); Barrie Dudley Brewster, Sussex (GB); Robert Gordon Livesey, West Sussex (GB)

(73) Assignee: ASML Netherlands B.V., Veldhoven (NL)

( * ) Notice: Subject to any disclaimer, the term of this patent is extended or adjusted under 35 U.S.C. 154(b) by 346 days.

(21) Appl. No.: 11/091,926

(22) Filed: Mar. 29, 2005

(65) Prior Publication Data
US 2006/0221314 A1 Oct. 5, 2006

(51) Int. Cl.
*G03B 27/32* (2006.01)
*G03B 27/42* (2006.01)

(52) U.S. Cl. .............. 355/30; 355/53; 355/67; 378/34; 250/492.1; 250/492.2

(58) Field of Classification Search .......... 355/30, 355/53, 67; 252/372; 250/491.2, 492.1, 250/492.2; 378/34, 35
See application file for complete search history.

(56) References Cited

U.S. PATENT DOCUMENTS

| 4,692,934 | A | * | 9/1987 | Forsyth ............... 378/34 |
| 4,901,668 | A | * | 2/1990 | Murakami ............ 118/722 |
| 5,305,364 | A | * | 4/1994 | Mochiji et al. ......... 378/34 |
| 5,559,584 | A | * | 9/1996 | Miyaji et al. .......... 355/73 |
| 5,696,623 | A | * | 12/1997 | Fujie et al. ........... 359/350 |
| 5,716,501 | A | * | 2/1998 | Kawashima et al. ... 204/192.26 |
| 6,333,775 | B1 | | 12/2001 | Haney et al. |
| 6,731,371 | B1 | * | 5/2004 | Shiraishi ............. 355/30 |
| 6,961,113 | B1 | * | 11/2005 | Hayashi et al. ........ 355/30 |
| 6,970,228 | B1 | * | 11/2005 | Aoki et al. ........... 355/30 |
| 2001/0038442 | A1 | | 11/2001 | Hansell et al. ........ 355/30 |
| 2002/0057422 | A1 | * | 5/2002 | Arakawa ............. 355/30 |
| 2002/0145711 | A1 | * | 10/2002 | Magome et al. ....... 355/30 |
| 2003/0190012 | A1 | | 10/2003 | Ahmad .............. 378/119 |
| 2004/0240506 | A1 | * | 12/2004 | Sandstrom et al. ..... 372/55 |
| 2005/0110966 | A1 | * | 5/2005 | Hasegawa ........... 355/30 |
| 2006/0007414 | A1 | * | 1/2006 | Littikhuis et al. ...... 355/30 |

FOREIGN PATENT DOCUMENTS

| EP | 0 957 402 A2 | 11/1999 |
| EP | 0 957 402 A3 | 3/2000 |
| EP | 1 098 225 A2 | 5/2001 |
| EP | 1 229 573 A1 | 8/2002 |

(Continued)

OTHER PUBLICATIONS

European Search Report issued for European Patent Application No. 06251739.6—2222, dated Dec. 1, 2006.

(Continued)

*Primary Examiner*—Della J. Rutledge
(74) *Attorney, Agent, or Firm*—Pillsbury Winthrop Shaw Pittman, LLP

(57) ABSTRACT

A lithographic apparatus includes a patterning device for patterning a beam of radiation, a projection system for projecting the patterned beam of radiation onto a substrate, a gas purged sealing aperture extending between different zones of the apparatus, and a gas supply arrangement for supplying a mixture of at least argon and hydrogen to the sealing aperture.

21 Claims, 2 Drawing Sheets

FOREIGN PATENT DOCUMENTS

| | | | |
|---|---|---|---|
| EP | 1329772 | * | 7/2003 |
| EP | 1 389 747 A2 | | 2/2004 |
| EP | 1 596 252 A1 | | 11/2005 |
| WO | WO 01/84241 A1 | | 11/2001 |
| WO | WO 03/087867 A2 | | 10/2003 |
| WO | WO 2005/096099 A2 | | 10/2005 |

OTHER PUBLICATIONS

Singapore Written Opinion issued for Singapore Patent Application No. 200602061-4, dated Sep. 10, 2007.

* cited by examiner

LITHOGRAPHIC APPARATUS, DEVICE MANUFACTURING METHOD, AND DEVICE MANUFACTURED THEREBY

FIELD

The present invention relates to a lithographic apparatus and a method for manufacturing a device. The invention also relates to devices manufactured by the apparatus and/or the device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction), while synchronously scanning the substrate parallel or anti-parallel to this direction. It is also possible to transfer the pattern from the patterning device to the substrate by imprinting the pattern onto the substrate.

The European patent application EP 0 957 402 A2, which is incorporated in the present application by reference, describes a lithographic apparatus, in which a projection system is separated from a substrate table by an intervening space. The intervening space can be at least partially evacuated. The intervening space contains a hollow tube that is continually flushed by a flow of gas to reduce cross-contamination between the substrate table and the projection system. The gas does not substantially absorb EUV radiation. According to EP 0 957 402 A2, the gas is Ar or Kr. During use, radiation is directed through the tube, from the projection system to a substrate, which is held by the substrate table. An advantage of the use of argon is, that the 'removability' or 'pumpability' of argon is relatively good. For example, in typical vacuum pumps used in lithographic apparatus, such as turbomolecular pumps, the pumping speed for argon (relative molecular mass 40) is relatively large compared to the pumping speed for very light gases, such as hydrogen (relative molecular mass 2), or very heavy gases like Xenon (relative molecular mass 131).

International application WO 01/84241 A1, which is also incorporated herein by reference, describes a lithographic apparatus and method, that includes a non-contact seal using a purge gas. Therein, a purged optical path between an optical source surface and an optical target surface is provided, as well as relative movement between the optical source surface and the optical target surface. A purge gas of a controlled purity is used.

SUMMARY

It is desirable to improve the lithographic apparatus, device manufacturing method, as well as devices manufactured thereby.

An aspect of the invention is to provide a reduction of cross-contamination between different zones of the lithographic apparatus.

A further aspect of the invention is to provide at least one seal for sealing different apparatus zones from each other, such that the seal prevents cross-contamination between the zones relatively well.

According to an aspect of the invention, there is provided a lithographic apparatus. The lithographic apparatus includes a patterning device for patterning a beam of radiation, a projection system for projecting the patterned beam of radiation onto a substrate, a gas purged sealing aperture extending between different zones of the apparatus, and a gas supply arrangement for supplying a mixture of at least argon and hydrogen to the sealing aperture.

The present invention is based on the inventive notion that a purge gas mixture that includes at least argon and hydrogen provides an improved sealing effect of the sealing aperture, as compared to the use of argon alone. Following from the invention, a suitably chosen mixture of argon and hydrogen provides a relatively high figure of merit concerning the sealing of the aperture, whereas this mixture is relatively easy to pump from the apparatus, as compared to the use of pure argon. Besides, by using a mixture of hydrogen and argon, thermal conductivity of the sealing gas is increased. Also, ionization effects that could emanate from the use of pure argon may be potentially quenched by the present invention. When the gas flow into the system is chosen to achieve a particular level of sealing performance, a suitably-chosen mixture of argon and hydrogen can cause lower absorption of illumination energy than either argon or hydrogen alone.

The invention is also based upon the inventive idea that neither the use of pure argon as a sealing gas, nor the use of pure hydrogen is advantageous. According to the invention, a suitable mixture of argon and hydrogen should be used, which combines the advantages of the use of pure hydrogen and argon and diminishes the disadvantages thereof. Surprisingly, this mixture provides an improved reduction of cross-contamination, for example, of moisture and hydrocarbons, whereas the mixture may be removed from the apparatus relatively easily and effectively, for example, by one or more turbomolecular pumps, even when using relatively high supply rates of the hydrogen and argon. For a non-limiting example, for a typical turbomolecular pump, the pumping speed for argon is about 2800 liters/s, while the corresponding pumping speed for hydrogen is only about 1800 liters/s. To a good approximation, the pumping speed of a 50%/50% mixture of the two gases will be halfway between, i.e. about 2300 liters/s.

The invention may be explained by the following inventive notions. Firstly, the performance of the sealing arrangement depends, among others, on the type of sealing gas used, and the flow rate of the gas. Also, a sealing gas species has molecules with a characteristic mass and collision cross-section with a contaminating species, which is to be blocked or removed, for example, by the sealing gas species. The characteristic mass and collision cross-section, as well as the flow rate, determine the effectiveness of the sealing gas for suppressing a contaminant flow. This effectiveness may be quantified for each gas by a diffusion constant $D_c$.

Secondly, following from the present invention, the more gas that is used for sealing the aperture, the more radiation, for example, EUV radiation, may be absorbed by that gas at a given pump capacity. For example, excessive gas flow may lead to an undesired attenuation of EUV projection radiation.

Therefore, following from the present invention, a figure of merit $F_m$ of a sealing gas species may be calculated as $F_m=1/(22.5.\alpha.D_c)$. It follows, according to the present invention, that argon has a relatively low figure of merit concerning the sealing of the aperture. Hydrogen has a relatively high figure of merit, at least higher than that of argon when using a projection beam having a small wavelength, for example, an EUV beam.

However, hydrogen has a relatively low molecular mass. Therefore, hydrogen is relatively difficult to remove from the apparatus, compared to argon, for example, when using one or more turbomolecular pumps having low compression ratio at low molecular mass. The low molecular mass of hydrogen, however, does lead to smaller conductance losses for gas flow within the apparatus.

Besides, the use of pure hydrogen in the system would require high flow hydrogen rates, leading to high pressures and explosion risk.

Thus, a suitable mixture of hydrogen and argon is used as a sealing fluid, which mixture provides a better sealing than argon by itself at a given absorption ratio, which mixture can be removed better than hydrogen by itself. Until the present invention, no one has come up to the idea to use a mixture of argon and hydrogen as a sealing gas mixture. Preferably, the mixture contains such an amount of argon, that the mixture contains as much hydrogen as possible, so that the possibility of explosion of the hydrogen is still prevented.

According to an aspect of the invention, there is provided a seal of a lithographic apparatus. The seal includes a gas purged sealing aperture extending between two zones of the apparatus. The seal is provided with at least one gas supply arrangement configured to supply a mixture containing substantially argon and hydrogen to the sealing aperture.

According to an aspect of the invention, a lithographic apparatus includes a fluid passage extending between at least two separate zones of the apparatus, and a gas supplying system configured to supply hydrogen gas and argon gas to the fluid passage.

The present invention further provides the use of a mixture containing substantially hydrogen and argon for flushing a sealing aperture of a lithographic projection apparatus.

According to an aspect of the invention, there is provided a device manufacturing method that includes projecting a patterned beam of radiation onto a substrate, sealing at least two zones within a lithographic apparatus from each other with at least one gas purged sealing aperture, and purging the sealing aperture with a mixture of at least argon and hydrogen.

According to an aspect of the invention, a device is provided. The device is manufactured using the apparatus according to the invention or according to the method as provided by the invention.

According to an aspect of the invention, a computer program containing one or more sequences of machine-readable instructions describing a device manufacturing method according to the invention is provided. A data storage medium having such a computer program is also provided.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
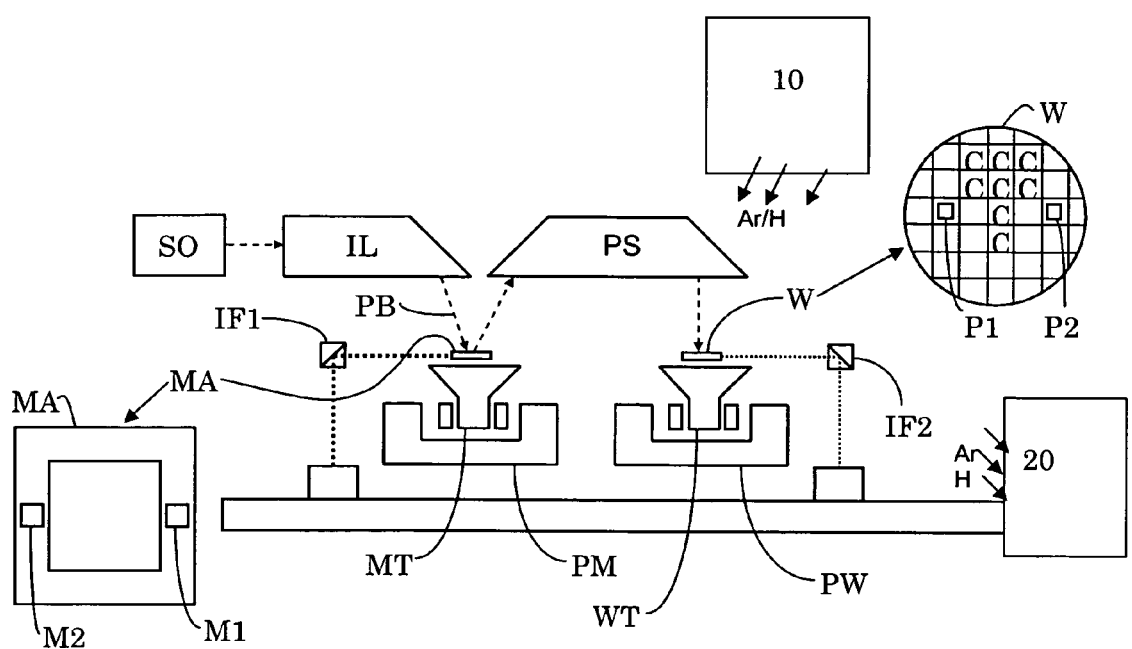
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam PB (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam PB by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system including, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam PB is incident on the patterning device (e.g., mask MA), which is held on the support structure (e.g., mask table MT), and is patterned by the patterning device. Having traversed the mask MA, the radiation beam PB passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam PB. Similarly, the first positioner PM and another position sensor IF1 can be used to accurately position the mask MA with respect to the path of the radiation beam PB, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIG. 1 further schematically shows that the apparatus also includes a gas supply system 10 for supplying a mixture of argon (Ar) and hydrogen (H) to the apparatus. Also schematically depicted is a pumping system 20, including one or more gas pumps, for removing the gasses at least partially from the apparatus. The gas supply system 10 is configured to supply a mixture of at least argon and hydrogen to a sealing aperture of the apparatus, to provide a gas purged sealing aperture. The sealing aperture is not specifically shown in FIG. 1, for clarity. The sealing aperture serves for sealing different zones of the apparatus from each other using the argon and hydrogen mixture.

Figure 2:
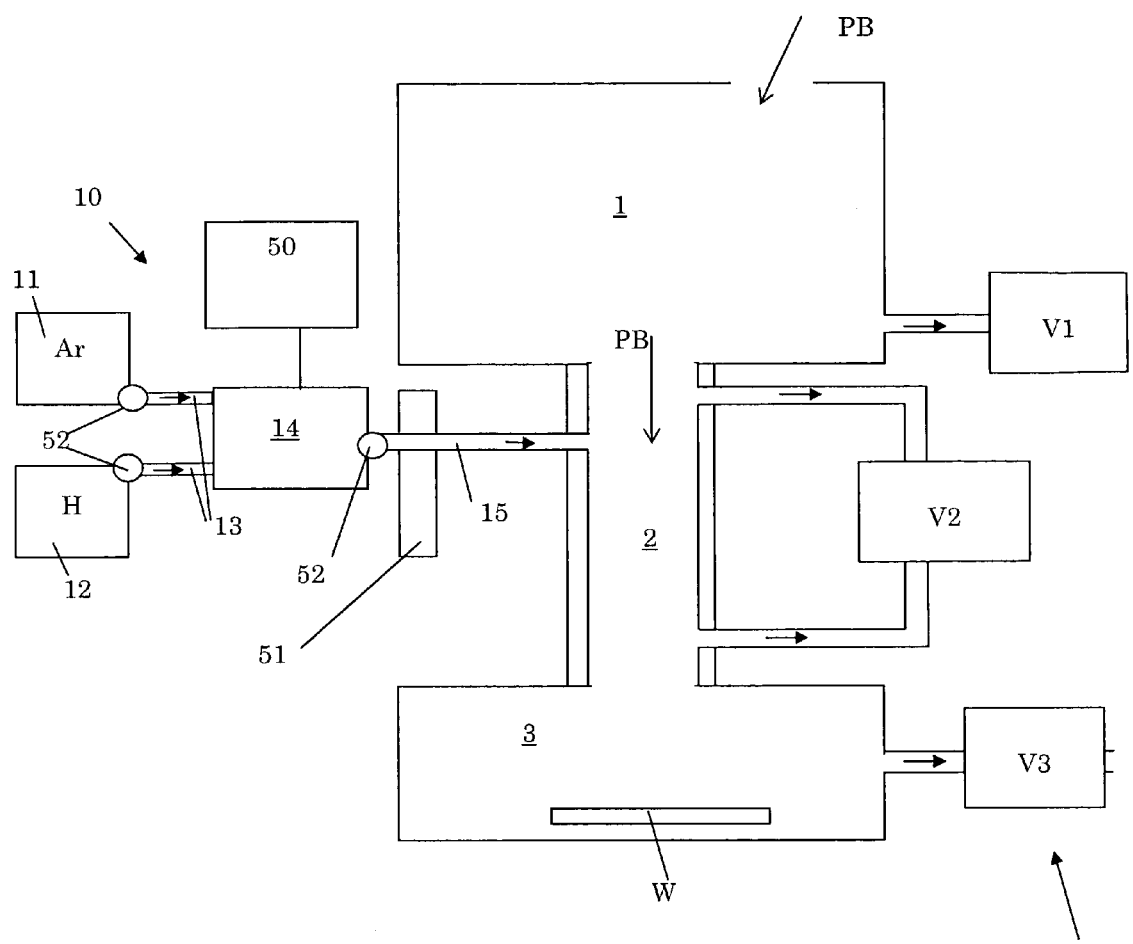
FIG. 2 schematically depicts a portion of the apparatus of FIG. 1.

FIG. 2 schematically depicts a further example of an embodiment of the invention, including a gas purged sealing aperture 2 which extends between two neighbouring zones 1, 3. In FIG. 2, the sealing aperture 2 is a fluid passage which extends between two substantially separated zones 1, 3 of the apparatus. The sealing aperture can also be referred to a dynamic gas lock, a dynamic gas seal, or the-like. Each sealing aperture may have various dimensions, orientations and forms.

The apparatus may include various such gas purged sealing apertures 2, each of which may extend between various zones of the apparatus. One or more of the gas purged sealing apertures may be used, for example, for transmitting the projection beam of radiation between parts of the apparatus, such as disclosed in the European patent application EP 0 957 402 A2. Also, the gas purged sealing aperture 2 may be used as part of a vibration isolator sealing assembly, such as or similar to the sealing assembly as is described in the U.S. Pat. No. 6,333,775, which is incorporated herein by reference, or to the arrangement disclosed by the international application WO 01/84241 A1. A source zone, including the above-mentioned radiation source SO, may be sealed by one or more sealing apertures according to the invention. For example, the sealing aperture can extend between an optics zone, including projection optics, the projection system PS, and an illuminator zone, including the illuminator IL; or the sealing aperture can extend between a source zone, including the radiation source SO, and an illuminator zone, including the illuminator IL.

For example, the sealing aperture 2 may extend between apparatus regions that are chosen from the following: an illumination zone for an illumination system that is configured to condition a radiation beam; a patterning device zone for the support that is constructed to support the patterning device MA, the patterning device MA being capable of imparting the radiation beam with a pattern in its cross-section to form a patterned radiation beam PB; a substrate zone 3 for the substrate table WS that is constructed to hold a substrate W; a source zone that includes the radiation source SO; and a projection optics zone 1 for the projection system PS configured to project the patterned radiation beam onto a target portion of the substrate.

In FIG. 2, for example, the sealing aperture 2 extends in the interface between an optics zone 1, containing projection optics, and a substrate zone 3, configured for holding at least one substrate W. Alternatively, for example, the sealing aperture extends between a patterning device zone, including support means for a pattering device, and the optics zone, containing projection optics, of the apparatus.

The pumping system 20 is particularly designed and configured for removing the hydrogen and argon from respective areas of the apparatus, to prevent a certain pressure build up therein. The pumping system 20 may include, for example, at least one pump, preferably at least a turbomolecular pump, which is suitable for evacuating one or more relevant zones of the apparatus to relatively low pressures. In the embodiment of FIG. 2, one or more first vacuum pumps V1 are coupled to the optics zone 1, for removing gasses therefrom. Also, one or more second vacuum pumps V2 are coupled to the sealing aperture 2, for removing gasses therefrom as well. The apparatus further includes, for example, one or more third vacuum pumps V3, for evacuating the substrate zone 3. One or more of the vacuum pumps V1, V2, V3 may also be integrated. In addition, pumping means may be provided for evacuating other regions of the apparatus. Each vacuum pump V1, V2, V3 may be coupled at various positions to a respective zone of the apparatus.

According to an aspect of the invention, the gas mixture includes 99 throughput % to 1 throughput % argon and 1 throughput % to 99 throughput % hydrogen. Herein, throughput % is specified in mbar.1/sec. Good results may be obtained when the mixture includes 79 throughput % to 39 throughput % argon and 21 throughput % to 61 throughput % hydrogen. For example, the mixture may include 69 throughput % to 49 throughput % argon and 31 throughput % to 51 throughput % hydrogen. Such a gas sealing mixture provides a surprisingly effective suppression of cross-contamination that may reach the sealing aperture 2. This gas mixture may be removed from the apparatus relatively well, for example, using one or more turbomolecular pumps. Also, the application of hydrogen in the gas mixture leads to smaller conductance losses of gas flow within the apparatus, since hydrogen has a relatively low molecular mass.

Table I compares a number of properties or argon and hydrogen.

TABLE 1

Properties of argon and hydrogen

| Gas | EUV absorption coefficient α $(mbar \cdot m)^{-1}$ at $\lambda = 13.5$ nm | Diffusion constant $D_c$ $(m^2/s)$, at 20 C. and 1 mbar |
|---|---|---|
| Argon | 3.41 | 0.01216 |
| Hydrogen | 0.12 | 0.04549 |

The diffusion constant was calculated, following Dayton (see Dayton, B. B., Foundations of Vacuum Science and Technology, Ed. J. Lafferty, Wiley, 1998). From Table I, it follows that argon has a relatively high absorption coefficient, in case EUV radiation of a wavelength $\lambda$ of 13.5 nm is used. Hydrogen has a lower absorption coefficient. In addition, Argon has a lower diffusion constant than hydrogen. Following from the present invention, the above-mentioned figure of merit $1/(22.5.\alpha.D_c)$ of hydrogen is higher than the same of argon, in the present example by a factor 7.4. Argon, on the other hand, may be removed more easily by vacuum pumps from the apparatus than hydrogen. Therefore, the present invention provides the use of the mixture of argon and hydrogen for purging the sealing aperture 2, which leads to a good reduction of cross-contamination between respective zones of the apparatus, in which one or more of these zones may be maintained at relatively low vacuum pressures.

As has been shown in the embodiment of FIG. 2 that the gas supply system 10 may include, for example, at least one argon gas supply arrangement including an argon reservoir 11, at least one hydrogen gas supply arrangement including a hydrogen reservoir 12, and one or more supply channels 13, 15 for interconnecting the argon and hydrogen reservoir 11, 12 to the sealing aperture 2. The gas supply system may be configured, for example, to supply a mixture containing substantially argon and hydrogen to the sealing aperture. In the present embodiment, the apparatus further includes a gas flow controller 14, which is arranged between the argon and hydrogen gas supply arrangements 11, 12. The flow controller 14 is configured to mix suitable flows of the hydrogen and argon, and to supply the resulting hydrogen/argon mixture via a channel 15 to the sealing aperture 2. Alternatively, the gas supplying system may be configured to supply the hydrogen and argon separately to the sealing aperture 2, such that a desired hydrogen/argon mixture is formed in the aperture 2. The gas supply arrangements may be configured in various other ways, as will be clear to the skilled person.

During operation, the apparatus of FIGS. 1 and/or 2 may be used in a device manufacturing method that includes projecting a patterned beam of radiation onto a substrate W, in which at least two zones 1, 3 are sealed from each other by at least one gas purged sealing aperture 2. Then, according to the invention, the sealing aperture is purged by a mixture of at least argon and hydrogen. The mixture preferably contains substantially argon and hydrogen only. For example, as follows from the above, the gas mixture can include 99 throughput % to 1 throughput % argon and 1 throughput % to 99 throughput % hydrogen, for example, 79 throughput % to 39 throughput % argon and 21 throughput % to 61 throughput % hydrogen, particularly 69 throughput % to 49 throughput % argon and 31 throughput % to 51 throughput % hydrogen. Herein, throughput % is specified in mbar.l/sec.

In a method according to the invention, the sealing aperture may extend at least between a substrate zone 3, configured for holding at least one substrate, and an optics zone 1, containing projection optics, of the apparatus, for preventing contamination from reaching the optics zone from the substrate zone 3. Preferably, during use, the at least one turbomolecular pump is pumping at least one of the zones and/or the sealing aperture to a certain desired or suitable pressure level. In the embodiment of FIG. 2, the hydrogen and argon are being mixed by the gas flow controller 14 before being supplied to the sealing aperture 2. Alternatively, the hydrogen and argon may be supplied separately to the sealing aperture, to form a suitable sealing gas mixture in the aperture. When the mixture is pumped by on or more turbomelecular pumps, undesired high temperatures of the rotors of the pumps can be prevented because of the use of a hydrogen/argon mixture, particularly compared to the known use of pure argon as a sealing gas. This can be explained by the relatively low thermal conductivity of argon, compared to a higher thermal conductivity of the argon/hydrogen mixture (for reference, the thermal conductivity of argon is 0.0174 W/mK while that for hydrogen is 0.175 W/mK). When pure argon is used, ionization effects may occur that may be damaging to optics of the apparatus. By using the mixture of argon and hydrogen, such ionization effects may be avoided, or at least be reduced.

Preferably, the flow rate of the mixture of argon and hydrogen is in the range of about 3-100 mbar.l/min. The flow rate is relatively high, for providing suppressing contamination flows effectively. On the other hand, the flow rate still provides for relatively low vacuum pressures in the apparatus, if desired and depending on the capacity of any installed vacuum pumping means.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" as used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm, for example, 13.5 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

For example, a gas purification system may be included, which is configured to perform a gas purification step on the argon, on the hydrogen and/or on the argon/hydrogen mixture. FIG. 2 shows schematically a gas purification system 51, that is downstream of the gas flow controller 14 to purify the hydrogen/argon mixture.

The gas supply arrangement may be configured in various ways, and may, for example, be configured to mix a predetermined gas ratio of hydrogen and argon, and to keep a predetermined pre-set gas ratio of hydrogen and argon for a desired time period.

The gas supply arrangement may include one or more valves 52 (see FIG. 2) or similar flow control means to control gas flows, as will be clear to the skilled person.

Also, the apparatus may include a suitable control 50, for example, a computer or a controller, to control gas mixture and gas flows. The control 50, which can be connected to the gas supply system in various ways, may be configured to control the at least one gas supply arrangement to supply a mixture of at least argon and hydrogen to the sealing aperture. Such a control 50 may operate, for example, using an above-mentioned computer program, when that program has been loaded into the control.

The sealing aperture may operate at various pressure regimes, for example, a pressure regime wherein flow is molecular or transitional, or in other pressure regimes, depending for example on dimensions of the sealing aperture.

What is claimed is:

1. A lithographic apparatus comprising:
   a projection system configured to project a patterned beam of radiation onto a substrate;
   a gas purged sealing aperture extending between different zones of the apparatus to seal the zones from each other; and
   a gas supply arrangement configured to supply a mixture of at least argon and hydrogen to the sealing aperture,
   wherein the sealing aperture extends between a substrate zone configured to hold the substrate, and an optics zone containing projection optics of the projection system.

2. An apparatus according to claim 1, wherein said mixture comprises 99 throughput % to 1 throughput % argon and 1 throughput % to 99 throughput % hydrogen, respectively.

3. An apparatus according to claim 2, wherein said mixture comprises 79 throughput % to 39 throughput % argon and 21 throughput % to 61 throughput % hydrogen, respectively.

4. An apparatus according to claim 1, further comprising a pump to evacuate at least one of said zones and/or at least part of said aperture.

5. An apparatus according to claim 4, wherein said pump comprises a turbomolecular pump.

6. An apparatus according to claim 1, wherein said gas supply arrangement comprises a hydrogen reservoir, an argon reservoir, and a supply channel to interconnect said hydrogen reservoir and said argon reservoir to the sealing aperture.

7. An apparatus according to claim 1, wherein said gas supply arrangement is configured to supply a mixture containing substantially argon and hydrogen to the sealing aperture.

8. An apparatus according to claim 1, further comprising a gas purification system configured to purify the argon, the hydrogen and/or the argon/hydrogen mixture during use.

9. An apparatus according to claim 1, wherein the gas supply arrangement is configured to mix a predetermined gas ratio of hydrogen and argon, and/or to keep a predetermined pre-set gas ratio of hydrogen and argon for a desired time period.

10. An apparatus according to claim 1, wherein the gas supply arrangement includes one or more valves to control one or more gas flows.

11. An apparatus according to claim 1, including a controller configured to control the gas supply arrangement to supply a mixture of at least argon and hydrogen to the sealing aperture.

12. A seal of a lithographic apparatus, the seal comprising a gas purged sealing aperture extending between a substrate zone configured to hold a substrate and an optics zone containing projection optics of the apparatus, wherein the seal is configured to seal the zones from each other and wherein the seal is provided with at least one gas supply arrangement configured to supply a mixture containing substantially argon and hydrogen to the sealing aperture.

13. A device manufacturing method comprising:
projecting a patterned beam of radiation onto a substrate;
sealing two zones within a lithographic apparatus from each other with at least one gas purged sealing aperture; and
purging said sealing aperture with a mixture of at least argon and hydrogen,
wherein the sealing aperture extends between a substrate zone, configured for holding at least one substrate, and an optics zone, including projection optics, of the apparatus.

14. A method according to claim 13, wherein said mixture comprises 99 throughput % to 1 throughput % argon and 1 throughput % to 99 throughput % hydrogen, respectively.

15. A method according to claim 14, wherein said mixture comprises 79 throughput % to 39 throughput % argon and 21 throughput % to 61 throughput % hydrogen, respectively.

16. A method according to claim 13, wherein at least one of said zones and/or at least part of said aperture is being pumped to a suitable pressure level.

17. A method according to claim 16, wherein at least one turbomolecular pump is used for pumping at least one of said zones and/or said at least part of said sealing aperture to a certain pressure level.

18. A method according to claim 13, wherein said hydrogen and argon are supplied separately to said sealing aperture and form a mixture in said aperture.

19. A method according to claim 13, wherein said hydrogen and argon are mixed before being supplied to said sealing aperture.

20. A method according to claim 13, wherein the flow rate of the mixture of argon and hydrogen is in the range of about 3-100 mbar.1/min.

21. A computer readable medium encoded with a program, the program containing one or more sequences of machine-readable instructions to perform a method comprising:
projecting a patterned beam of radiation onto a substrate;
sealing two zones within a lithographic apparatus from each other with at least one gas purged sealing aperture; and
purging said sealing aperture with a mixture of at least argon and hydrogen,
wherein said sealing aperture extends between a substrate zone, configured for holding at least one substrate, and an optics zone, including projection optics, of the apparatus.

* * * * *